US008552421B2

(12) United States Patent
Lee et al.

(10) Patent No.: US 8,552,421 B2
(45) Date of Patent: Oct. 8, 2013

(54) ORGANIC MICROELECTRONIC DEVICE AND FABRICATION METHOD THEREFOR

(75) Inventors: Sang Yoon Lee, Seoul (KR); Shinuk Cho, Santa Barbara, CA (US); Ji Youl Lee, Seoul (KR); Alan J. Heeger, Santa Barbara, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/413,109

(22) Filed: Mar. 6, 2012

(65) Prior Publication Data

US 2013/0234116 A1    Sep. 12, 2013

(51) Int. Cl.
*H01L 33/00* (2010.01)

(52) U.S. Cl.
USPC .......................................................... 257/40

(58) Field of Classification Search
USPC .......................................................... 257/40
See application file for complete search history.

(56) References Cited

U.S. PATENT DOCUMENTS

2009/0127547 A1    5/2009   Luebben et al.

OTHER PUBLICATIONS

Journal of Materials chemistry vol. 20 issue: 13 pages: 2562-2574 2010 "Solution-processed organic transistors based on semiconducting blends".
Adv. Materials. 2009, 21, 1166-1171, "High-performance polymer-small blend organic transistors".
Adv. Materials, vol. 22, No. 32, 3598-3598, 2010 "Air-stable solution-processed hybrid transistors with hole and electron mobilities exceeding 2 cm2 V-1 S-1".

*Primary Examiner* — Zandra Smith
*Assistant Examiner* — Damian A Hillman
(74) *Attorney, Agent, or Firm* — Harness, Dickey & Pierce, P.L.C.

(57) ABSTRACT

An organic electronic device includes an active region polarity definition layer, and a bulk heterojunction active layer formed on the active region polarity definition layer. The bulk heterojunction active layer includes an upper region and a lower region having respective majority carriers localized therein of different polarities.

26 Claims, 12 Drawing Sheets

ORGANIC MICROELECTRONIC DEVICE AND FABRICATION METHOD THEREFOR

BACKGROUND

1. Field

Example embodiments provide an organic electronic device and a fabrication method thereof, and more particularly, an organic electronic device including a bulk heterojunction active layer and a fabrication method thereof.

2. Description of the Related Art

Development of organic electronic devices that may be fabricated into a non-volatile, higher speed, lower cost, and flexible device, compared to the existing inorganic electronic devices, has increased. Recently, performance of an organic electronic device has been proven to be an important element of an electronic device, e.g., a smart card, an RFID tag, and/or an active matrix display, which is inexpensive, flexible, and portable. The organic electronic device may be integrated into the existing inorganic semiconductor integrated circuit system to fabricate an analog circuit, a digital logic circuit, and a memory. Accordingly, there are increasing demands for an organic electronic device having higher integration and formed by a simplified process.

SUMMARY

Some example embodiments provide an organic electronic device including a bulk heterojunction active layer. Other example embodiments provide a dual gate organic field effect transistor including a bulk heterojunction active layer. Other example embodiments provide a dual gate ambipolar organic field effect transistor including a bulk heterojunction active layer. Other example embodiments provide a complementary organic field effect transistor including a bulk heterojunction active layer. Other example embodiments provide a solar cell including a bulk heterojunction active layer. Other example embodiments provide a method for fabricating an organic electronic device including a bulk heterojunction active layer.

According to an example embodiment, an organic electronic device may include an active region polarity definition layer, and a bulk heterojunction active layer formed on the active region polar definition layer. The bulk heterojunction active layer includes an upper region and a lower region having respective majority carriers localized therein of different polarities.

In the upper region and the lower region of the bulk heterojunction active layer, a mobility of the majority carriers having the same polarity is different. A surface of the active region polarity definition layer may have a hydrophobic characteristic and the majority carriers in the lower region of the bulk heterojunction active layer may be p-type carriers. The surface of the active region polarity definition layer may have a hydrophilic characteristic and the majority carriers in the lower region of the bulk heterojunction active layer may be n-type carriers.

The active region polarity definition layer may have a thickness of about 1 nm to about 30 nm. The bulk heterojunction active layer may consist of a mixture of a donor and an acceptor, the donor may be selected from the group consisting of poly(3-hexylthiophene) (P3HT), poly[2-methoxy-5-(2'-ethyl-hexyloxy)-1,4-phenylene vinylene] (MEH-PPV), poly[2,1,3-benzothiadiazole-4,7-diyl [4,4-bis(2-ethylhexyl)-4H-cyclopenta[2,1-b: 3,4-bldithiophene-2,6-diyl] (PCPDTBT), and copper phthalocyanine (CuPc), and the acceptor may be selected from the group consisting of [6,6]-Phenyl-C61-butyric acid methyl ester (C60-PCBM), [6,6]-Phenyl-C71-butyric acid methyl ester (C70-PCBM), perylene, and 3,4,9,10-perylenetetracarboxylic-bis-benzimidazole (PTCBI).

The bulk heterojunction active layer consists of a mixture of a donor and an acceptor, and the mixture is selected from the group consisting of a mixture of PCPDTBT and C70-PCBM, a mixture of P3HT and C60-PCBM, and a mixture of P3HT and C70-PCBM.

The active region polarity definition layer may include at least two active regions, and a device isolation region may be between the at least two active regions. A polarity slope of the bulk heterojunction active layer on the device isolation region may be smaller than a polarity slope of the bulk heterojunction active layer on the at least two active regions.

The active region polarity definition layer may include first and second active region polarity definition layers corresponding with first and second active regions of the active region polarity definition layer. A device isolation region may be between the first and second active regions. The first active region polarity definition layer and the second active region polarity definition layer may have different surface characteristics, and the majority carriers in the lower region of the bulk heterojunction active layer on the first active region polarity definition layer and the majority carriers in the lower region of the bulk heterojunction active layer on the second active region polarity definition layer may have different polarities.

The polarity slope of the bulk heterojunction active layer on the device isolation region may be smaller than the polarity slope of the bulk heterojunction active layer on the first and second active region polarity definition layers. The organic electronic device may be a dual gate organic field effect transistor (OFET). The dual gate OFET may further include a lower gate insulating layer configured to contact the lower region of the active region polarity definition layer, a lower gate electrode configured to contact the lower gate insulating layer, an upper gate insulating layer configured to contact the bulk heterojunction active layer, an upper gate electrode configured to contact the upper gate insulating layer, and a source/drain electrode configured to contact one of the lower gate insulating layer and the upper gate insulating layer.

The organic electronic device may be an ambipolar dual gate organic field effect transistor, and the lower gate electrode and the upper gate electrode may be electrically connected.

The organic electronic device may be a vertically integrated complementary organic field effect transistor. The vertically integrated complementary OFET may further include a lower organic field effect transistor including a first polar channel consisting of the lower region of the bulk heterojunction active layer, and an upper organic field effect transistor including a second polar channel consisting of the upper region of the bulk heterojunction active layer.

The organic electronic device may be a multijunction solar cell, and the bulk heterojunction active layer may be a plurality of bulk heterojunction active layers sequentially stacked.

According to an example embodiment, an analog circuit may include the aforementioned organic electronic device.

According to another example embodiment, a method for fabricating an organic electronic device may include forming an active region polar definition layer, and forming a bulk heterojunction active layer on the active region polar definition layer, the bulk heterojunction active layer including an upper region and a lower region having majority carriers of different respective polarities localized therein.

In the upper region and the lower region of the bulk heterojunction active layer, a mobility of majority carriers having the same polarity is different. A surface of the active region polarity definition layer may have a hydrophobic characteristic and the majority carriers in the lower region of the bulk heterojunction active layer may be p-type carriers. The surface of the active region polarity definition layer may have a hydrophilic characteristic and the majority carriers in the lower region of the bulk heterojunction active layer may be n-type carriers.

The active region polarity definition layer may be formed such that the thickness is in the range of about 1 nm to about 30 nm. Forming the bulk heterojunction active layer may include forming a film with a mixture of a donor and an acceptor by a solution process. The donor may be selected from the group consisting of poly(3-hexylthiophene) (P3HT), poly[2-methoxy-5-(2'-ethyl-hexyloxy)-1,4-phenylene vinylene] (MEH-PPV), poly[2,1,3-benzothiadiazole-4,7-diyl[4,4-bis(2-ethylhexyl)-4H-cyclopenta[2,1-b:3,4-b] dithiophene-2,6-diyl] (PCPDTBT), and copper phthalocyanine (CuPc), and the acceptor is selected from the group consisting of [6,6]-Phenyl-C61-butyric acid methyl ester (C60-PCBM), [6,6]-Phenyl-C71-butyric acid methyl ester (C70-PCBM), perylene, and 3,4,9,10-perylenetetracarboxylic-bis-benzimidazole (PTCBI).

Forming the bulk heterojunction active layer may include forming a film with a mixture of a donor and an acceptor by a solution process. The mixture may be selected from the group consisting of a mixture of PCPDTBT and C70-PCBM, a mixture of P3HT and C60-PCBM, and a mixture of P3HT and C70-PCBM.

After forming the film, a first annealing process may be performed at a lower temperature than a lower of glass transition temperatures of each of the donor and the acceptor. After the performing the first annealing process, a second annealing process may be performed at a higher temperature than a lower of the glass transition temperatures of each of the donor and the acceptor, and at a lower temperature than a higher of the glass transition temperatures of each of the donor and the acceptor.

Forming the active region polarity definition layer may include forming at least two active regions in the active region polarity definition layer, and separately patterning the active region polarity definition layer according to the at least two active regions so as to expose a device isolation region. Forming the bulk heterojunction active layer may include forming the bulk heterojunction active layer such that a polarity slope of the bulk heterojunction active layer on the device isolation region is smaller than a polarity slope of the bulk heterojunction active layer on the at least two active regions.

Forming the active region polarity definition layer may include forming first and second active regions in the active region polarity definition layer, and separately patterning the active region polarity definition layer according to the first and second active regions so as to expose a device isolation region and form first and second active region polarity definition layers corresponding with the first and second active regions, the first and second active region polarity definition layers having different surface characteristics.

Forming the bulk heterojunction active layer may include forming the bulk heterojunction active layer such that the majority carriers in the lower region of the bulk heterojunction active layer on the first active region polarity definition layer and the majority carriers in the lower region of the bulk heterojunction active layer on the second active region polarity definition layer have different polarities.

The bulk heterojunction active layer may be formed such that the polarity slope of the bulk heterojunction active layer on the device isolation region may be smaller than the polarity slope of the bulk heterojunction active layer on the first and second active region polarity definition layers. Forming the bulk heterojunction active layer may include sequentially stacking a first bulk heterojunction active layer and a second bulk heterojunction active layer on the active region polar definition layer.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
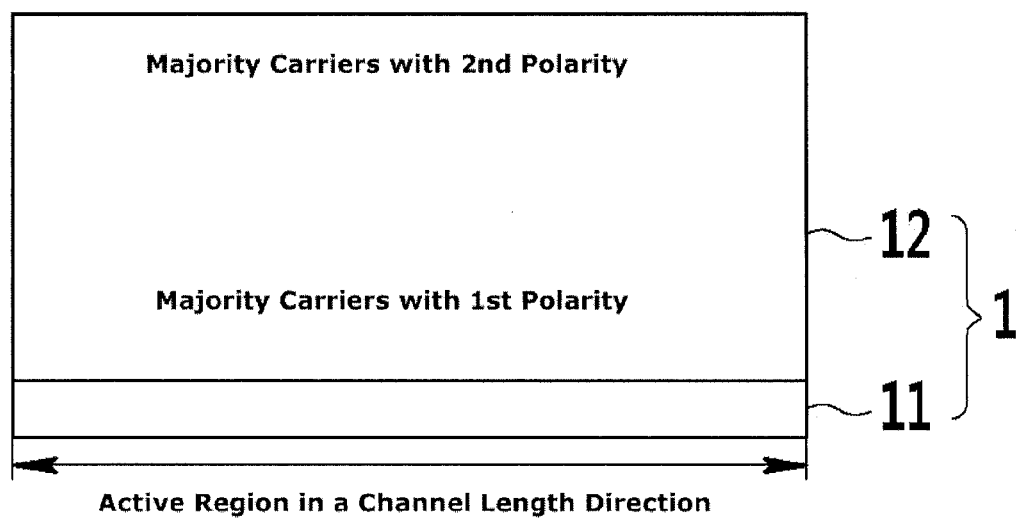
FIG. 1 is a first direction cross-sectional view of an active layer constituting an organic electronic device according to an example embodiment.

The advantages and characteristics described herein, and the method of achieving them, may be more clearly understood with reference to the accompanying drawings and example embodiments. However, it should be understood that the disclosure is not limited to the following examples and may be realized with different embodiments.

Example embodiments have merely been provided to ensure the completeness of the disclosure and to aid the understanding of a person having ordinary knowledge in the art to fully understand the scope of the disclosure as defined by the claims. Thus, in some example embodiments, well-known technologies may not have been specifically explained in the interest of brevity. Unless otherwise defined, all terms used in the specification (including technical and scientific terms) may be used as meanings commonly understood to a person having ordinary knowledge in the art.

Furthermore, unless explicitly stated, the terms defined in a dictionary are not to be interpreted in a manner that would be repugnant to their generally-accepted meanings. In addition, unless explicitly described to the contrary, the words "include" and "comprise" and variations such as "includes," "including," "comprises," and "comprising" will be understood to imply the inclusion of the stated elements but not the exclusion of other unstated elements. Unless specifically described to the contrary, a singular form may include a plural form. Example embodiments described in the specification are explained with reference to idealistic drawings of schematic diagrams. Therefore, the parts shown in the drawings may have outline properties and they are not to limit the categories of the disclosure. The same reference numerals designate the same constituent elements throughout the specification.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus; a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
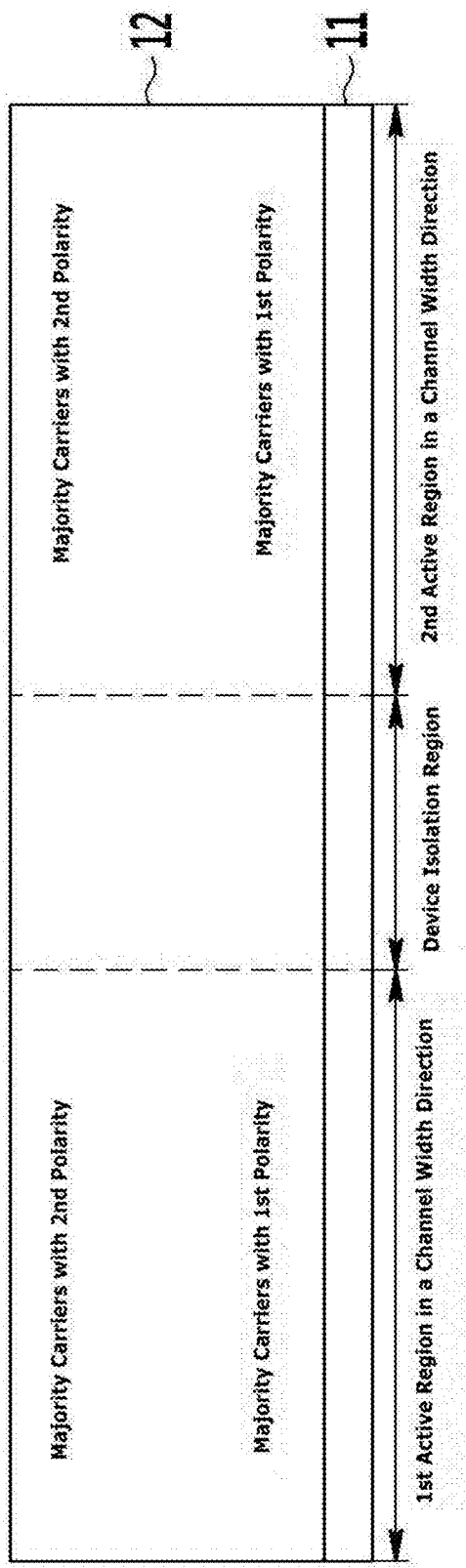
FIG. 2A to FIG. 2C are second direction cross-sectional views of an active layer constituting an organic electronic device according to an example embodiment.
Figure 2B:
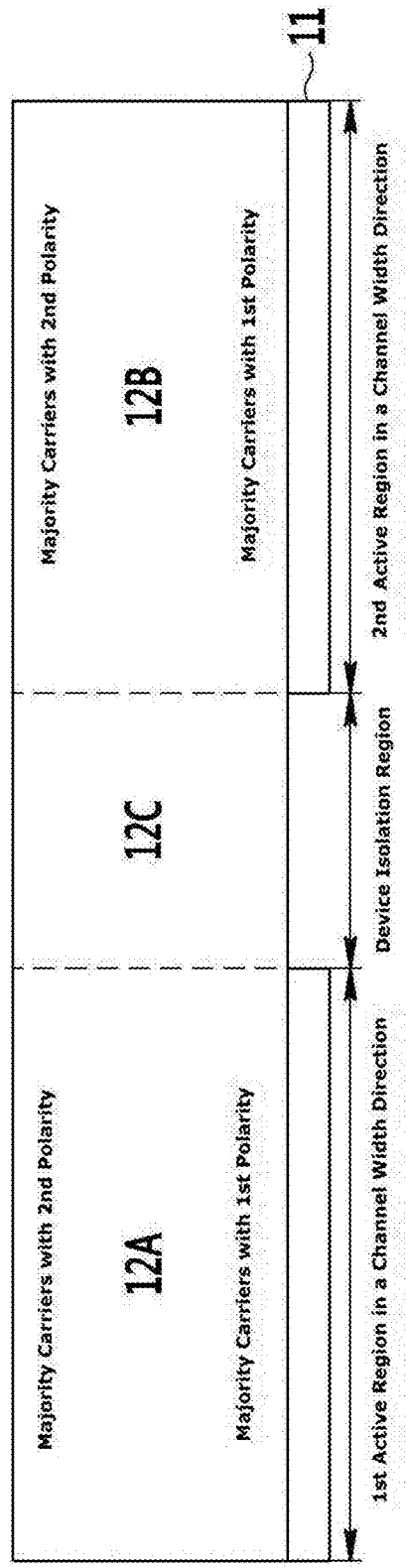
Figure 2C:
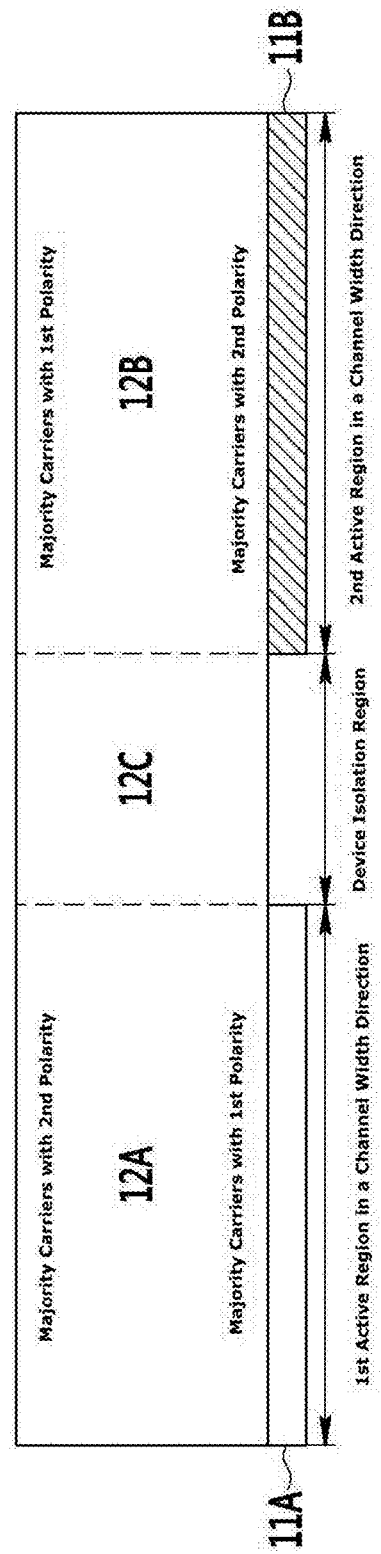
Figure 3:
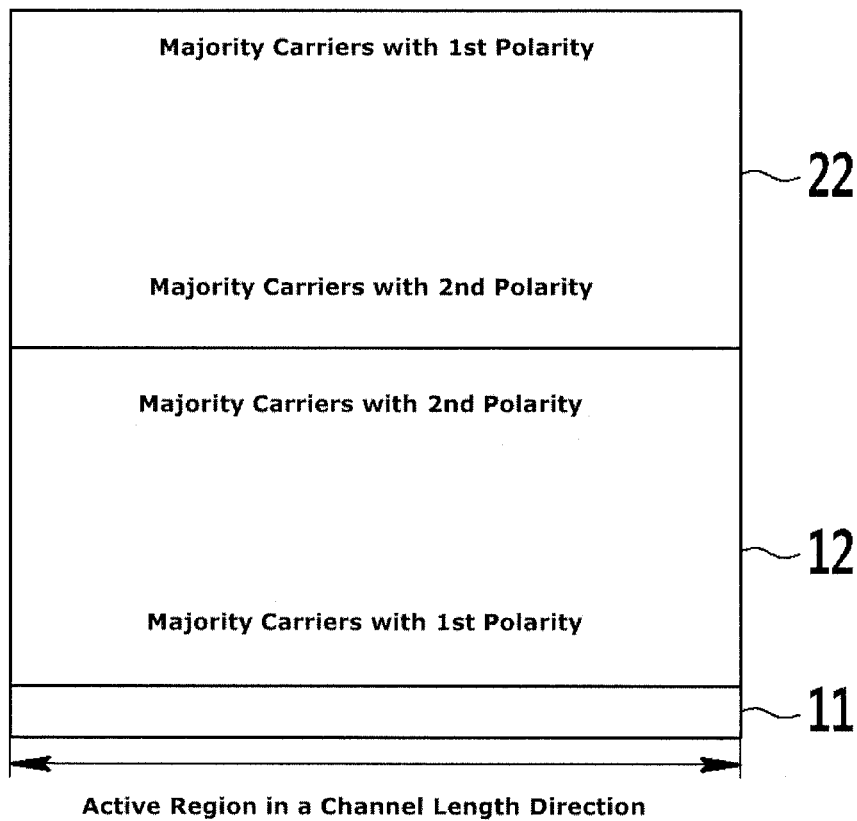
FIG. 3 is a cross-sectional view of a tandem-stacked active layer constituting an organic electronic device according to example embodiments.

FIGS. 1 to 3 are cross-sectional views of an active layer constituting an organic electronic device according to an example embodiment.

FIG. 1 is a first direction cross-sectional view of an active layer. The first direction may be a channel length direction of the organic electronic device. Referring to FIG. 1, an active layer 1 includes a bulk heterojunction active layer 12 wherein a donor and an acceptor are vertically phase-separated, and majority carriers mainly localized in the upper region and majority carriers mainly localized in the lower region have different polarity. As illustrated in FIG. 1, majority carriers of a first polarity are mainly localized in the lower region of the bulk heterojunction active layer 12, and majority carriers of a second polarity are mainly localized in the upper region. As a result, mobility of a carrier with the same polarity may become different in the lower channel and the upper channel of the bulk heterojunction active layer 12.

The donor may be a p-type carrier, and the acceptor may be an n-type carrier. Thus, if phase separation of the donor and acceptor occurs such that the acceptors are mainly localized in the upper region and the donors are mainly localized in the lower region, an n-type channel may be formed in the upper region and a p-type channel may be formed in the lower region. Therefore, if mobility of a hole is measured in the lower channel and the upper channel of the bulk heterojunction active layer 12, the mobility in the lower channel may become larger than the mobility in the upper channel.

To the contrary, if mobility of an electron is measured in the lower channel and the upper channel of the bulk heterojunction active layer 12, mobility of an electron in the upper channel may become larger than the mobility of an electron in the lower channel. The different polarity between the upper region carriers and the lower region carriers may be explained by the fact that the degree of polarity becomes different from the lower region to the upper region, and thus, the polarity has a slope.

As such, the different polarity of upper and lower region carriers of the bulk heterojunction active layer 12 may be determined according to the surface condition of an active region polarity definition layer 11. According to the surface condition of the active region polarity definition layer 11, phase separation of donor and acceptor materials constituting the bulk heterojunction active layer 12 may be facilitated.

If the surface of the active region polarity definition layer 11 is hydrophilic, an acceptor constituting the bulk heterojunction active layer 12 may be mainly localized on the surface of the active region polarity definition layer 11, and the lower region of the bulk heterojunction active layer 12 may have a plurality of n-type carriers. Thus, n-type polarity may become smaller from the lower region to the upper region. As a result, the lower region of the bulk heterojunction active layer 12 may provide an N-channel, and the upper region may provide a P-channel.

To the contrary, if the surface of the active region polarity definition layer 11 is hydrophobic, a donor constituting the bulk heterojunction active layer 12 may be mainly localized on the surface of the active region polarity definition layer 11, and the lower region of the bulk heterojunction active layer 12 may have a plurality of p-type carriers. Thus, p-type polarity may become smaller from the lower region to the upper region. As a result, the lower region of the bulk heterojunction active layer 12 may provide a P-channel, and the upper region may provide an N-channel.

The active region polarity definition layer 11 having a hydrophobic or hydrophilic surface characteristic may be formed of a self-assembled monolayer material or insulating material.

If the end of the self-assembled monolayer material has a hydrophobic functional group, e.g., $-CH_3$ or $-CF_3$, the surface of the active region polarity definition layer 11 may be hydrophobic, and if the end of the self-assembled monolayer material has a hydrophilic functional group, e.g., $-OH$ or $-COOH$, the surface of the active region polarity definition layer 11 may be hydrophilic.

Non-limitative examples of the self-assembled monolayer material having a hydrophobic functional group may include octadecyltrichlorosilane (OTS), hexadecanethiol (HDT), and octadecyltrichlorosilane (ODTS). Non-limiting examples of the self-assembled monolayer material having a hydrophilic functional group may include 4-(11-mercaptoundecanoxy)azobenzene (MUA) having an azobenzene end that becomes hydrophilic by UV irradiation.

If an active region polarity definition layer 11 is formed of an organic insulating material, e.g., β-staged-divinyl-siloxane benzocyclobutene (BCB), an acryl-based organic compound or perfluorocyclobutane (PFCB), the surface may become hydrophobic. If the active region polarity definition layer 11 is dry ashed in a vacuum state, the surface may be changed to hydrophilic.

To remove a solvent included in the active region polarity definition layer 11, a heat treatment may be conducted. The heat treatment may be conducted at a temperature of about 110 to 130° C. for 5 to 10 minutes.

If a self-assembled monolayer is used, the thickness of the active region polarity definition layer 11 may be in the range of about 1 nm to about 3 nm by the length of the self-assembled monolayer, and if an organic insulating material is used to define a thin film, the thickness may be in the range of about 1 nm to about 30 nm. To form a thin film with a uniform thickness, the thickness may be about 1 nm or more, and if the thickness is about 30 nm or less, dielectric constant deterioration due to the active region polarity definition layer 10 may be prevented or inhibited.

The main distribution of the majority carriers in the upper and lower region of the bulk heterojunction active layer 12 may be controlled by the surface characteristic of the active region polarity definition layer 11 as well as by conditions of annealing that is performed after forming the bulk heterojunction active layer 12 by a solution process.

The bulk heterojunction active layer 12 may be formed by a solution process using a bulk heterogeneous mixture in which a donor material and an acceptor material are dissolved together. Non-limiting examples of the solution process may include spin coating, inkjet printing, screen printing, and droplet deposition.

As the donor material, a semiconductor polymer, e.g., a poly(paraphenylene vinylene) (PPV) type of material, polythiophene (PT) derivatives, a polyfluorene (PF) type of material and copolymers thereof, may be used. As the organic monolayer material, a phthalocyanine type of material, e.g., CuPc, and ZnPc, may be used. Non-limiting examples of the donor material may include poly(3-hexylthiophene) (P3HT), poly[2-methoxy-5-(2'-ethyl-hexyloxy)-1,4-phenylene vinylene] (MEH-PPV), poly[2,1,3-benzothiadiazole-4,7-diyl[4,4-bis(2-ethylhexyl)-4H-cyclopenta[2,1-b:3,4-b1 dithiophene-2,6-diyl] (PCPDTBT), and copper phthalocyanine (CuPc), as illustrated in Chemical Formula 1.

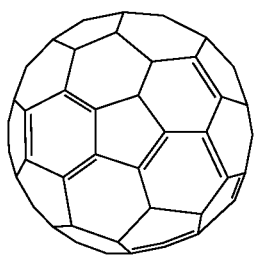

C60

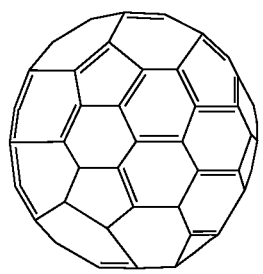

C70

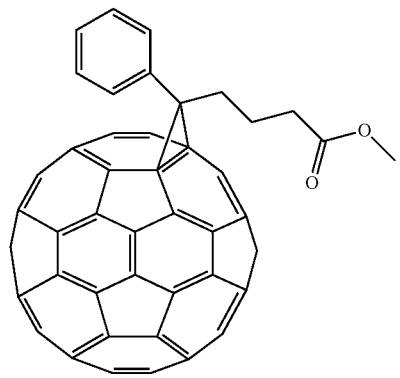

C$_{60}$-PCBM

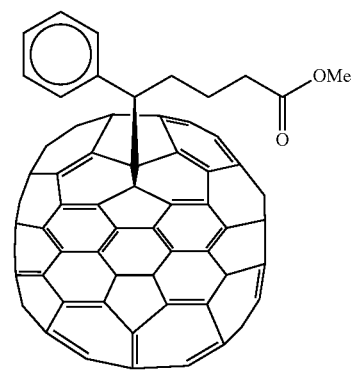

C$_{70}$-PCBM

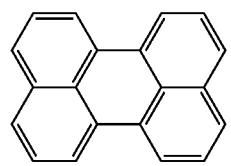

perylene

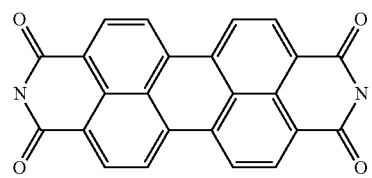

PTCBI

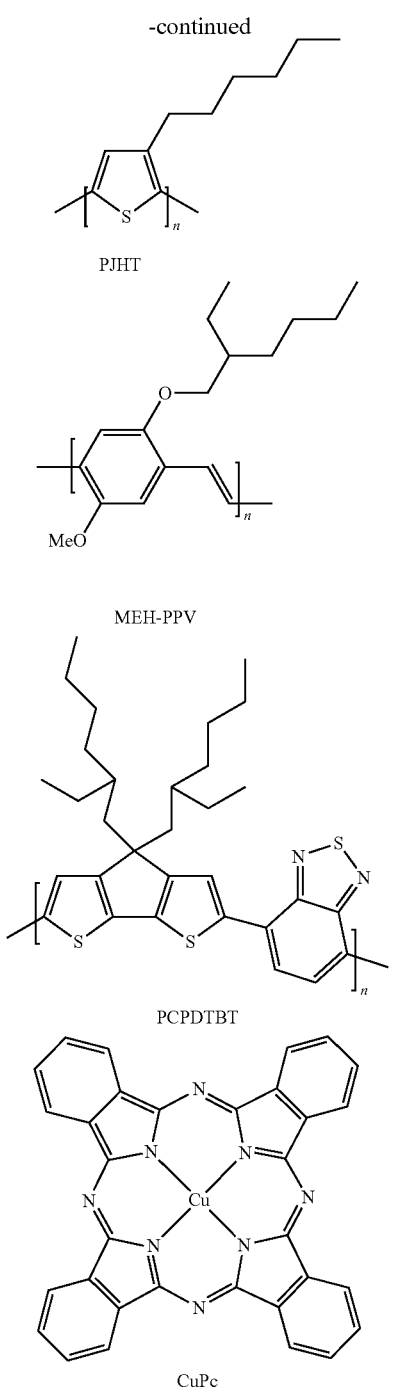

PJHT

MEH-PPV

PCPDTBT

CuPc

The acceptor material may include fullerene (C60 or C70) and/or fullerene derivative designed such that fullerene may be properly dissolved in an organic solvent (C60-PCBM, C70-PCBM). Further, perylene and 3,4,9,10-perylenetetra-carboxylic-bis-benzimidazole (PTCBI) may be used as a monolayer material.

The weight [wt %] ratio of the donor and acceptor may be about 1:0.1 to about 1:1. To simultaneously exhibit properties of the donor and acceptor, the mixing ratio may be at least about 1:0.1.

The annealing process may be varied according to the combination of the donor and acceptor used. The annealing may be commonly conducted at a temperature lower than a glass transition temperature (Tg) thereof. For example, the annealing may be conducted at a temperature of about 90% of the glass transition temperature. If the donor and acceptor are mixed, the annealing may be conducted at a lower temperature than the lower glass transition temperature of the donor and acceptor. For example, the annealing may be conducted at a temperature of about 90% of the lower glass transition temperature.

Further, primary annealing may be conducted at a lower temperature than a lower glass transition temperature of the donor and acceptor, for example, at a temperature of about 90% of the lower glass transition temperature, and secondary annealing may be conducted at a higher temperature than the lower glass transition temperature and lower than the higher glass transition temperature, for example, at a temperature of about 90% of the higher glass transition temperature.

If the combination of donor and acceptor is a combination of PCPDTBT and C70-PCBM, annealing may be conducted at about 150° C. for about 10 to about 30 minutes. According to circumstances, primary annealing may be conducted at about 80° C. for about 5 to about 10 minutes, and secondary annealing may be conducted at about 150° C. for about 10 to about 20 minutes.

If the combination of donor and acceptor is a combination of poly(3-hexylthiophene) (P3HT) and C60-PCBM, annealing may be conducted at about 120° C. for about 10 to about 30 minutes. According to circumstances, primary annealing may be conducted at about 80° C. for about 5 to about 10 minutes, and secondary annealing may be conducted at about 120° C. for about 10 to about 30 minutes.

The thickness of the bulk heterojunction active layer 12 may be in the range of about 50 nm to about 200 nm. In order for phase separation to effectively occur in the bulk heterojunction active layer 12, the thickness may be about 50 nm or more, and to prevent or inhibit an OFF current increase by bulk conductivity in the bulk heterojunction active layer 12, the thickness may be about 200 nm or less.

FIG. 2A to FIG. 2C are second direction cross-sectional views of the bulk heterojunction active layer. The second direction may be a channel width direction of the organic electric field device.

FIG. 2A illustrates an example wherein both an active region polarity definition layer 11 and a bulk heterojunction active layer 12 are formed on a device isolation region. In this case, polarity slopes of the bulk heterojunction active layer 12 on the device isolation region and on the first and second active regions may be substantially equivalent.

FIG. 2B illustrates an example wherein the active region polarity definition layer 11 is patterned according to first and second active regions to expose a device isolation region therebetween. Since an active region polarity definition layer 11 for controlling a polarity slope does not exist on the device isolation region, the degree of phase separation of the bulk heterojunction active layer 12C on the device isolation region may be smaller, compared to the degree of phase separation of the acceptor and donor of the bulk heterojunction active layers 12A and 12B. Specifically, the polarity slope of the bulk heterojunction active layer 12C on the device isolation region may become smaller than the polarity slope of the bulk heterojunction active layers 12A and 12B on the active region polarity definition layer 11, to reinforce device separation.

FIG. 2C illustrates an example wherein the surface conditions of the first active region polarity definition layer 11A on the first active region and the second active region polarity definition layer 11B on the second active region are different. Therefore, the polarity of the majority carriers of the lower region of the bulk heterojunction active layer 12A on the first active region polarity definition layer 11A and the polarity of the majority carriers of the lower region of the bulk heterojunction active layer 12B on the second active region polarity definition layer 11B may be varied. Thereby, variability and flexibility may be provided for circuit integration using a field effect transistor formed on the active layers 12A and 12B.

Further, since an active region polarity definition layer 11 for controlling a polarity slope does not exist on the device isolation region, device separation may be reinforced in the same manner as illustrated in FIG. 2B. The first active region polarity definition layer 11A and the second active region polarity definition layer 11B may be respectively formed using separate materials having different surface characteristics. Alternatively, an active region polarity definition layer may be formed using a single material and then patterned according to first and second active regions, and dry ashing or UV treatment may be conducted only on the second active region, so the surface characteristics of the first active region polarity definition layer 11A and the second active region polarity definition layer 11B may be different.

FIG. 3 illustrates a tandem-stacked active layer constituting an organic electronic device according to example embodiments. If a light absorption band of the material constituting a lower bulk heterojunction active layer 12 and a light absorption band of the material constituting an upper bulk heterojunction active layer 22 are different, the tandem-stacking structure may embody a multi-layer junction solar cell. The main distribution of the upper and lower majority carriers of the lower bulk heterojunction active layer 12 may be determined according to the surface condition of the active region polarity definition layer 11, and the main distribution of the upper and lower majority carriers of the upper bulk heterojunction active layer 22 may be determined according to the surface condition and/or annealing condition of the lower bulk heterojunction active layer 12. For example, the surface of the active region polarity definition layer 11 may be hydrophobic, the lower bulk heterojunction active layer 12 may be formed of a mixture of PCPDTBT and C70-PCBM, and the upper bulk heterojunction active layer 22 may be formed of a mixture of poly(3-hexylthiophene) (P3HT) and C60-PCBM.

In the bulk heterojunction active layer according to example embodiments, carriers may be mainly localized in the active layer by film formation with a single solution process. Thus, organic field effect transistors having different polarities may be simultaneously embodied on both of the upper and lower regions of the active layer. Therefore, a dual gate ambipolar organic field effect transistor may be formed by a simplified process. Further, a complementary organic field effect transistor that is vertically integrated using the active layer may be embodied by a simplified process, and the integration of the organic electronic device may be increased. In addition, the active layer may be tandem-stacked to form a multijunction solar cell having a wider absorption band. Hereinafter, example embodiments of various kinds of organic electronic devices embodied using the active layer according to example embodiments as explained referring to FIG. 1 through FIG. 3 will be explained.

Figure 4A:
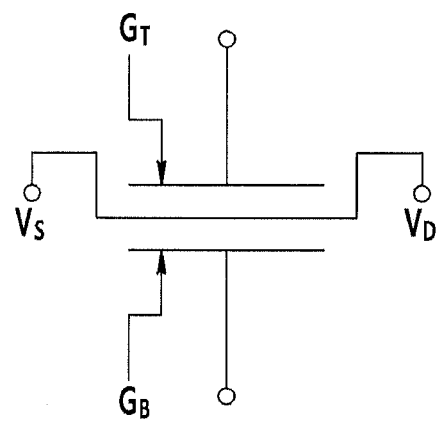
FIG. 4A and FIG. 4B are respectively an equivalent circuit diagram and a cross-sectional view of a dual gate organic field effect transistor according to an example embodiment.
Figure 4B:
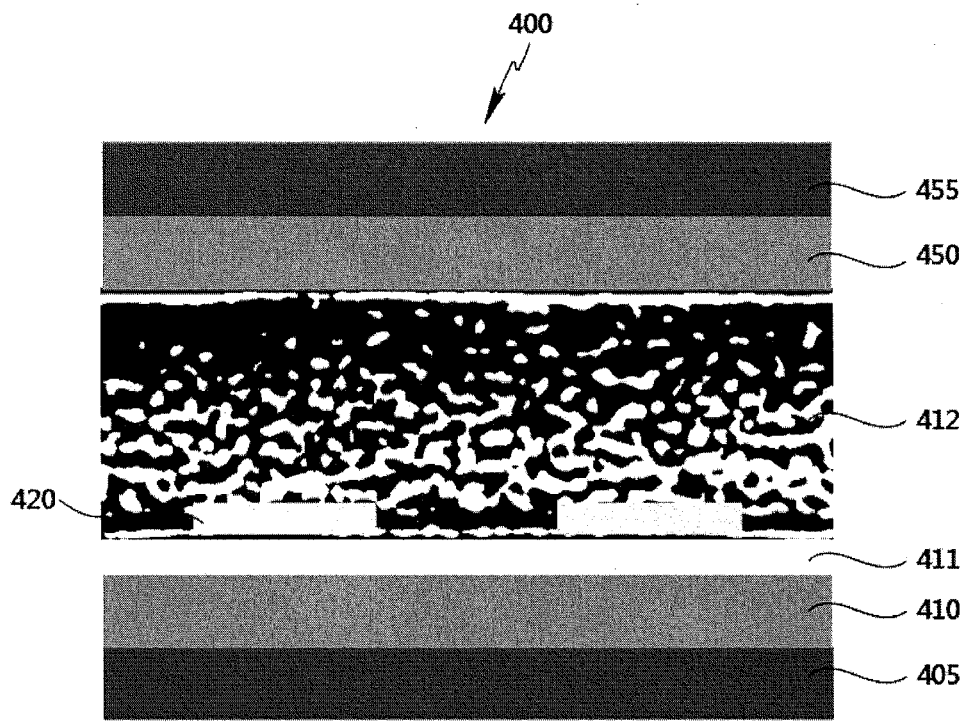

FIG. 4A and FIG. 4B are respectively an equivalent circuit diagram and a cross-sectional view of a dual gate organic field effect transistor (hereinafter, dual gate OFET) 400. Referring to FIG. 4A and FIG. 4B, the dual gate OFET 400 is equipped with upper and lower gate insulating layers 450 and 410, and upper and lower gate electrodes 455 and 405 on both sides of a bulk heterojunction active layer 412 including majority carriers of upper and lower carriers with different polarities. An active region polarity definition layer 411 is interposed between the lower gate insulating layer 410 and the bulk heterojunction active layer 412. A source/drain electrode 420 is formed on the active region polarity definition layer 411 and contacts the bulk heterojunction active layer 412. However, the source/drain electrode (420, $V_S/V_D$) may be formed on the bulk heterojunction active layer 412 so as to contact the upper gate insulating layer 450.

The operation of the dual gate OFET 400 will be explained with reference to an example wherein the majority carriers of the lower region and upper region of the bulk heterojunction active layer 412 are p-type carriers and n-type carriers, respectively. If a positive voltage is applied to the upper gate electrode (455, $G_T$), the lower gate electrode (405, $G_B$) is allowed to float and a positive voltage is applied to the drain, so the dual gate OFET 400 may be operated as an N-channel device. If a negative voltage is applied to the lower gate electrode (405, $G_B$), the upper gate electrode (455, $G_T$) is allowed to float and a negative voltage is applied to the drain, so the dual gate OFET 400 may be operated as a P-channel device. If the upper gate electrode (455, $G_T$) and the lower gate electrode (405, $G_B$) are connected, the dual gate OFET 400 may be operated as an ambipolar dual gate OFET.

Figure 5:
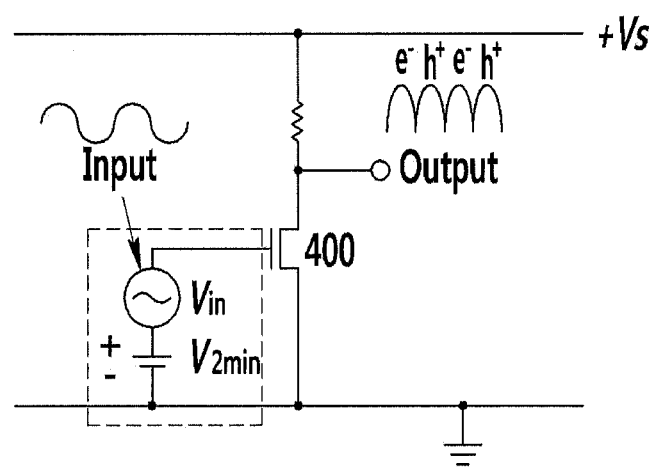
FIG. 5 is a circuit diagram of a frequency multiplier capable of being embodied by an ambipolar dual gate organic field effect transistor according to an example embodiment.

The ambipolar dual gate OFET 400 may embody a frequency multiplier as illustrated in FIG. 5. For example, if an input signal (Vin) of about 10 kHz is input in the ambipolar dual gate OFET 400, an output signal of about 20 kHz may be output. Further, although not illustrated in the drawings, the ambipolar dual gate organic field effect transistor may be applied for an analog circuit for full wave rectification and/or phase shift keying. In addition, the ambipolar dual gate organic field effect transistor may be used for the construction of various digital logic circuits, e.g., a combinational logic circuit or a sequential logic circuit.

Hereinafter, an example construction of an inverter, which is a representative example of a digital logic circuit, will be explained referring to FIG. 6A and FIG. 8B.

Figure 6A:
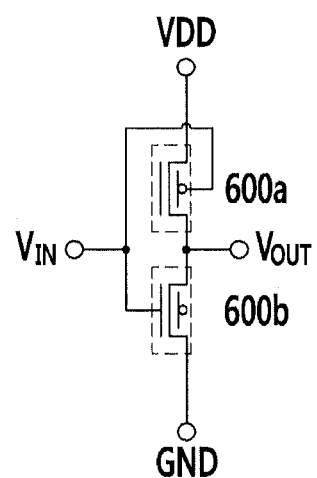
FIG. 6A and FIG. 6B are respectively an equivalent circuit diagram and a cross-sectional view of an inverter consisting of two dual gate organic field effect transistors according to an example embodiment.
Figure 6B:
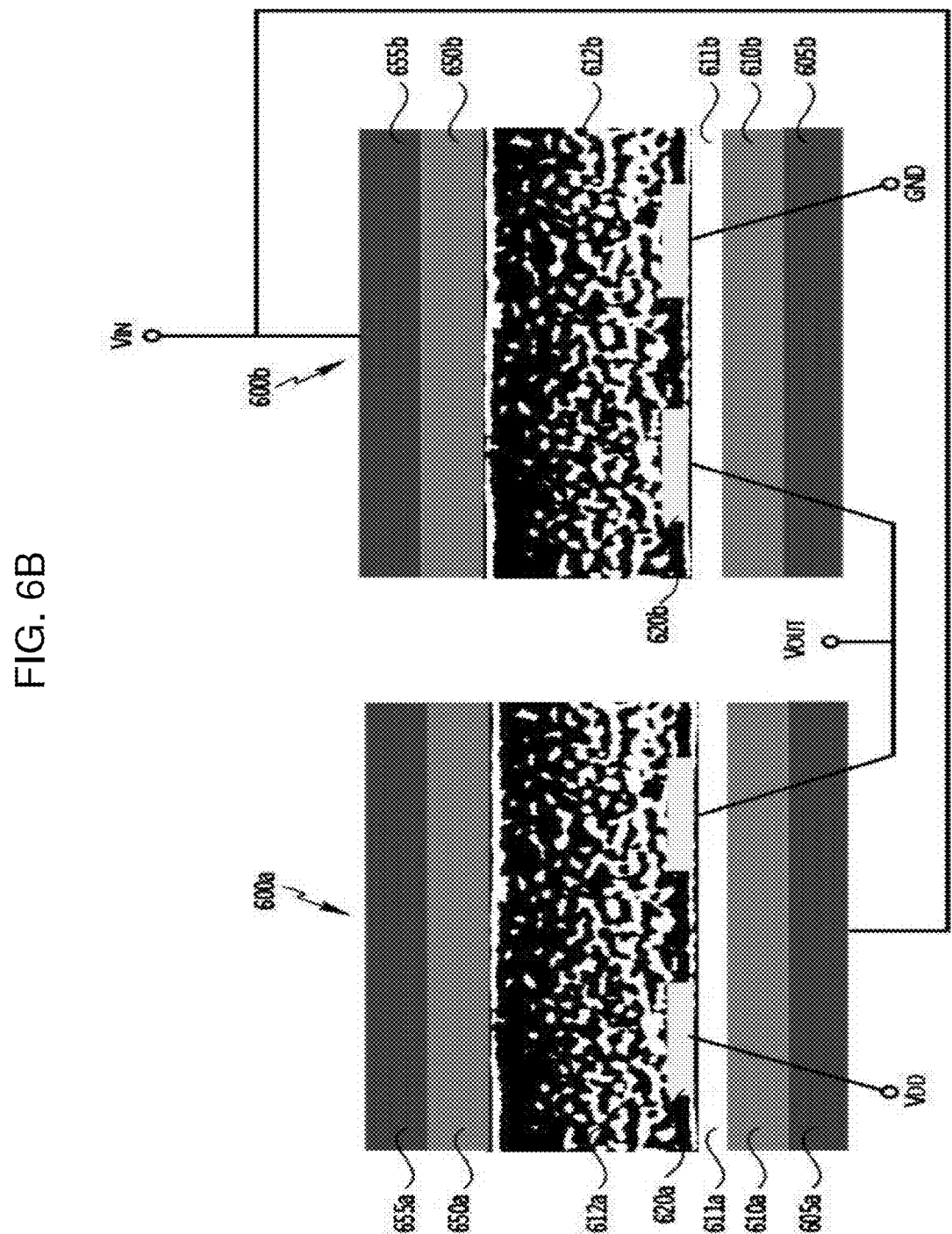

FIG. 6A and FIG. 6B are respectively an equivalent circuit and a cross-sectional view of an inverter consisting of two dual gate OFETs 600a and 600b according to an example embodiment. FIG. 6A and FIG. 6B illustrate a case wherein the majority carriers localization of the upper and lower regions are identical in first and second dual gate OFETs 600a and 600b The first and second ambipolar dual gate OFETs 600a and 600b are respectively equipped with upper gate insulating layers 650a and 650b, lower gate insulating layers 610a and 610b, upper gate electrodes 655a and 655b, and lower gate electrodes 605a and 605b on both sides of the bulk heterojunction active layers 612a and 612b having upper and lower region majority carriers with different polarities. Active region polarity definition layers 611a and 611b are interposed between the lower gate insulating layers 610a and 610b, and the bulk heterojunction active layers 612a and 612b. Source/drain electrodes 620a and 620b are formed on the active region polarity definition layers 611a and 611b to contact the bulk heterojunction active layers 612a and 612b.

In the case wherein the majority carriers of the lower region of the bulk heterojunction active layer 612a and 612b are p-type carriers and the majority carrier of the upper region are n-type carriers, the lower gate electrode 605a of the first dual gate OFET 600a and the upper gate electrode 655b of the second dual gate OFET 600b are connected with an input terminal (Vin). The input terminal of the first dual gate OFET 600a is connected with a first power supply, for example, a driving voltage (Vdd), and the output terminal of the second dual gate OFET 600b is connected with a second power supply, for example, a ground voltage (GND). The output terminal of the first dual gate OFET 600a and the input terminal of the second dual gate OFET 600b are connected with the output terminal (Vout) of the inverter.

Figure 7A:
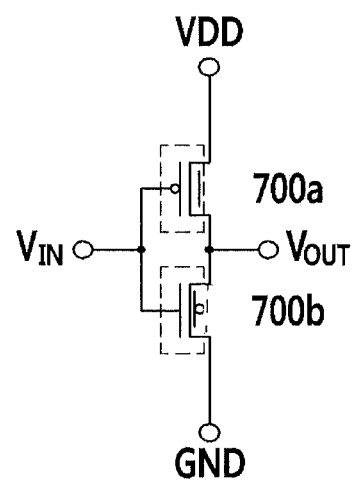
FIG. 7A and FIG. 7B are respectively an equivalent circuit diagram and a cross-sectional view of an inverter consisting of two dual gate organic field effect transistors according to an example embodiment.
Figure 7B:
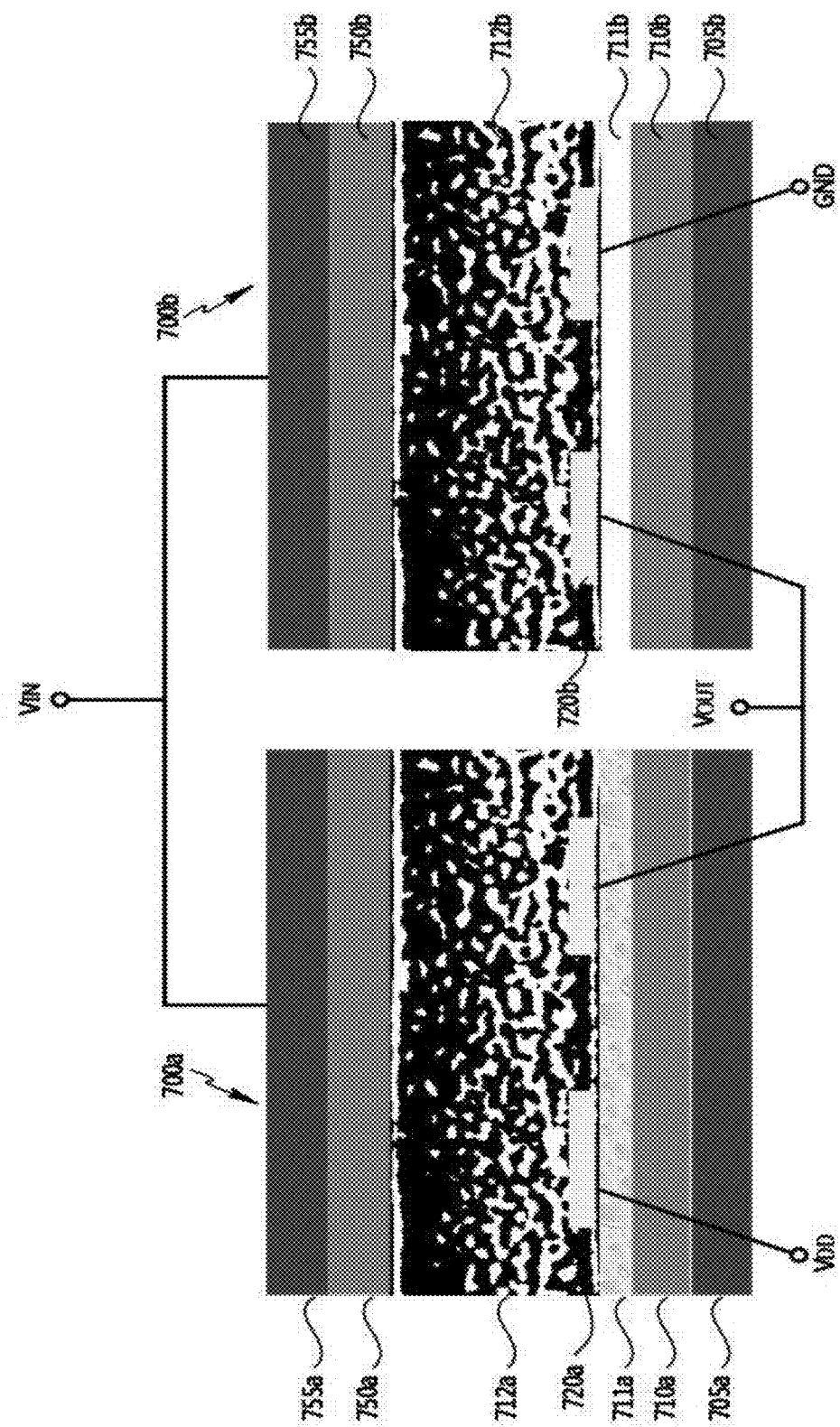

FIG. 7A and FIG. 7B are respectively an equivalent circuit diagram and a cross-sectional view of an inverter consisting of two dual gates OFET 700a and 700b. FIG. 7A and FIG. 7B illustrate a case wherein the majority carriers localization of the upper and lower regions of the bulk heterojunction active layers 712a and 712b constituting the first and second dual gates OFET 700a and 700b are opposite. The first and second dual gates OFET 700a and 700b are respectively equipped with upper gate insulating layers 750a and 750b, lower gate insulating layers 710a and 710b, upper gate electrodes 755a and 755b, and lower gate electrodes 705a and 705b, on both sides of the bulk heterojunction active layer 712a and 712b including upper and lower region majority carriers with different polarities.

Active region polarity definition layers 711a and 711b are interposed between the lower gate insulating layers 710a and 710b, and the bulk heterojunction active layers 712a and 712b. Source/drain electrodes 720a and 720b are formed on the active region polarity definition layers 711a and 711b to contact the bulk heterojunction active layers 712a and 712b.

The first active region polarity definition layer 711a and the second active region polarity definition layer 711b are formed of materials having different functional end groups. For example, the functional end group of the first active region polarity definition layer 711a may be hydrophilic, and the functional end group of the second active region polarity definition layer 711b may be hydrophobic.

In this case, the majority carriers of the lower region of the first bulk heterojunction active layer 712a may be n-type, and the majority carriers of the lower region of the second bulk heterojunction active layer 712b may be p-type. Thus, the upper gate electrode 755a of the first dual gate OFET 700a and the upper gate electrode 755b of the second dual gate OFET 700b may be connected with an input terminal (Vin). Therefore, gate electrode wiring may be simpler than illustrated in FIG. 6B. The input terminal of the first dual gate OFET 700a may be connected with a first power supply, for example, a driving voltage (Vdd), and the output terminal of the second dual gate OFET 700b may be connected with a second power supply, for example, ground voltage (GND). The output terminal of the first dual gate OFET 700a and the input terminal of the second dual gate OFET 700b may be connected with an output terminal (Vout) of the inverter.

Figure 8A:
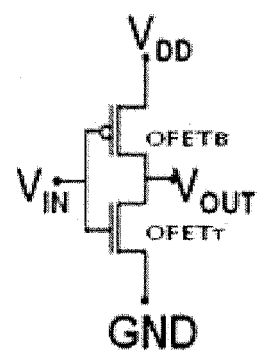
FIG. 8A and FIG. 8B are respectively an equivalent circuit diagram and a cross-sectional view of an inverter consisting of vertically integrated complementary organic field effect transistors according to an example embodiment.
Figure 8B:
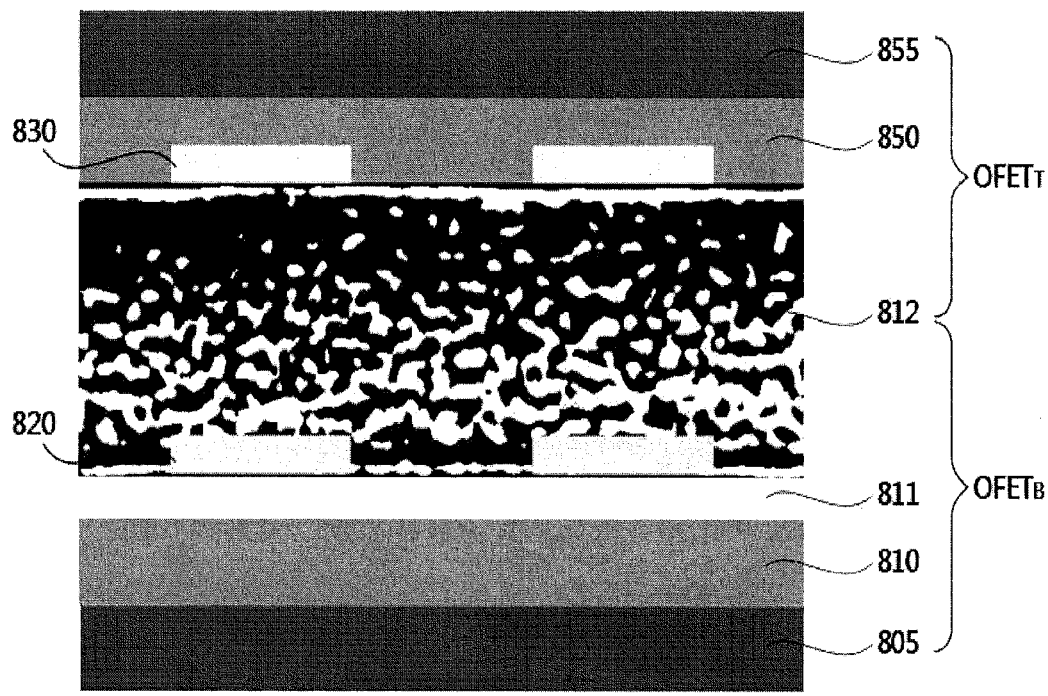

FIG. 8A and FIG. 8B are respectively an equivalent circuit diagram and a cross-sectional view of an inverter consisting of a vertically integrated complementary organic field effect transistor (COFET) according to an example embodiment.

The complementary organic field effect transistor includes a vertically integrated lower organic field effect transistor (OFET$_B$) and upper organic field effect transistor (OFET$_T$). The lower organic field effect transistor (OFET$_B$) includes a first polarity channel consisting of the lower region of a bulk heterojunction active layer 812 including upper and lower region majority carriers with different polarities. The upper organic field effect transistor (OFET$_T$) includes a second polarity channel consisting of the upper region of the bulk heterojunction active layer 812.

The lower organic field effect transistor (OFET$_B$) includes a lower gate insulating layer 810 contacting an active region polarity definition layer 811 contacting the lower region of the bulk heterojunction layer 812, and a lower gate electrode 805 contacting the lower gate insulating layer 810. The upper organic field effect transistor (OFET$_T$) includes an upper gate insulating layer 850 contacting the upper region of the bulk heterojunction active layer 812, and an upper gate electrode 855 contacting the upper gate insulating layer 850.

A source/drain electrode 820 of the lower organic field effect transistor (OFET$_B$) contacts the first polarity channel consisting of the lower region of the bulk heterojunction active layer 812 on the active region polarity definition layer 811. A source/drain electrode 830 of the upper organic field effect transistor (OFET$_T$) contacts the second polarity channel consisting of the upper region of the bulk heterojunction layer 812 on the bulk heterojunction layer 812.

In the case wherein the majority carriers of the lower region of the bulk heterojunction active layer 812 are p-type and the majority carriers of the upper region are n-type, the lower gate electrode 805 and the upper gate electrode 855 are connected with an input terminal (Vin). The input terminal of the lower organic field effect transistor (OFET$_B$) is connected with a first power supply, for example, a driving voltage (Vdd), and the output terminal of the upper organic field effect transistor (OFET$_T$) is connected with a second power supply, for example, a ground voltage (GND). The output terminal of the lower organic field effect transistor (OFET$_B$) and the input terminal of the upper organic field effect transistor (OFET$_T$) are connected with the output terminal (Vout).

The organic electronic devices according to example embodiments as explained referring to FIG. 4A to FIG. 8B may be formed on a substrate formed of an insulating material with a higher dielectric constant. Non-limitative examples of the substrate may include a silicon wafer substrate, a ceramic substrate, a glass substrate, and a plastic substrate. The kind of the substrate may be appropriately selected by a person of ordinary skill in the art according to the use of the organic integrated circuit. As a plastic substrate, polyethylene naphthalate, polyethylene terephthalate, polycarbonate, polyacrylate, polyimide, polynorbornene, and polyethersulfone may be examples without specific limitation.

The lower gate electrode (405, 605a, 605b, 705a, 705b, 805) may be formed of a conductive material, e.g., a conductive polymer or metal. If the substrate is a silicon wafer or a ceramic substrate, the substrate may be formed of doped silicon, gold, silver, aluminum, copper, nickel, chromium, molybdenum, tungsten, a combination thereof, and a stacking structure thereof. If the substrate is formed of doped silicon and has conductivity, the substrate may be patterned to form a lower gate electrode (405, 605a, 605b, 705a, 705b, 805). If the substrate is a glass substrate or a plastic substrate, the lower gate electrode (405, 605a, 605b, 705a, 705b, 805) may be formed of a conductive material or conductive polymer that may be formed by coating. Non-limitative examples of the conductive material may include indium tin oxide (ITO), fluorine tin oxide (FTO), ZnO—Ga$_2$O$_3$, ZnO—Al$_2$O$_3$, and/or SnO$_2$—Sb$_2$O$_3$. As the conductive polymer, materials, for example, phenylpolyacetylene, a polymer, e.g., polydiphenylacetylene, poly(t-butyl)diphenylacetylene, poly(trifluorinemethyl)diphenylacetylene, poly(bistrifluorinemethyl)acetylene, poly-bis(t-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl)phenylacetylene and a derivative thereof, and polythiophene may be used.

As the lower gate insulating layer (410, 610a, 610b, 710a, 710b, 810), a commonly used insulator with a larger dielectric constant may be used. Non-limitative examples thereof may include a ferroelectric insulation layer selected from the group consisting of BST, Al$_2$O$_3$, Ta$_2$O$_5$, La$_2$O$_5$, Y$_2$O$_3$ and TiO$_2$, an inorganic insulation layer selected from the group consisting of PZT, Bi$_4$Ti$_3$O$_{12}$, BaMgF$_4$, SrBi$_2$(TaNb)$_2$O$_9$, BZT, BaTiO$_3$, SrTiO$_3$, Bi$_4$Ti$_3$O1$_2$, SiO$_2$, SiN$_x$, and AlON, and an organic insulator, e.g., polyimide, benzenecyclobutene (BCB), parylene, polyacrylate, polyvinyl alcohol, polyvinylphenol, polystyrene, and CYTOP®. The thickness of the first gate insulating layer 120 may be in the range of about 1000 to about 3000 Å, but may be variously modified according to use and necessity.

The source/drain electrode (420, 620a, 620b, 720a, 720b, 820, 830) may be formed of a conductive material, e.g., a metal, a metal alloy, a conductive oxide, and a conductive polymer. Non-limiting examples of the metal or metal alloy may include gold, silver, aluminum, copper, nickel, molybdenum, tungsten, and an alloy thereof (for example, a molybdenum/tungsten alloy). Non-limiting examples of the conductive oxide may include indium tin oxide (ITO), and indium zinc oxide (IZO). Non-limiting examples of the conductive polymer may include polythiophene, polyaniline, polyacetylene, polypyrole, polyphenylene vinylene, and a polyethylene dioxythiophene (PEDOT)/polystyrene sulfonate (PSS) mixture. The source/drain electrode (420, 620a, 620b, 720a, 720b, 820, 830) may have a thickness of about 500 to about 2000 Å, and may be patterned by a common method according to use and necessity.

The upper gate insulating layer (450, 650a, 650b, 750a, 750b, 850) may be formed of organic insulating material that may be dissolved in an orthogonal solvent that does not dissolve the bulk heterojunction active layer (412, 612a, 612b, 712a, 712b, 812). Non-limiting examples of the organic insulating material may include polyimide, benzenecyclobutene, parylene, polyacrylate, polyvinyl alcohol, polyvinylphenol, polystyrene, and CYTOP®. The thickness of the upper gate insulating layer (450, 650a, 650b, 750a, 750b, 850) may be in the range of about 1000 to about 3000 Å, but may be variously modified according to the used and necessity.

The upper gate electrode (455, 655, 655b, 755a, 755b, 855) may be formed of a conductive material, e.g., a metal and a conductive polymer, in the same manner as the lower gate electrode (405, 605a, 605b, 705a, 705b, 805).

The active region polarity definition layer (411, 611a, 611b, 711a, 711b, 811) and the bulk heterojunction active layer (412, 612a, 612b, 712a, 712b, 812) are substantially equivalent to the active region polarity definition layer 11 and bulk heterojunction active layer 12 as explained referring to FIG. 1, and thus, the explanations thereof are skipped.

The organic electronic device according to example embodiments as explained referring to FIG. 4A to FIG. 8B may be modified in various modes.

Hereinafter, various example embodiments are disclosed in more detail with reference to the following examples. However, it should be understood that the following are merely example embodiments and are not limiting as to the scope of the disclosure.

EXPERIMENTAL EXAMPLES

Fabrication of Dual Gate Organic Field Effect Transistor

A silicon oxide layer is formed on a silicon substrate doped with n-type impurities to a thickness of about ~3000 Å. Subsequently, an OTS layer having a hydrophobic functional group is formed on the silicon oxide layer, a source/drain electrode consisting of aluminum is patterned on the OTS layer, a bulk heterogeneous mixture having a mixing ratio of PCDTBT:PCBM of about 1:4 is formed as a film on the OTS layer and the source/drain layer by a solution process, and then primary annealing is conducted at about 80° C. for about 5 minutes and secondary annealing is conducted at about 150° C. for about 30 minutes.

Subsequently, CYTOP® is formed to a thickness of about 500 nm, and an aluminum layer is stacked and patterned to form an upper gate electrode.

The finally fabricated dual gate organic field effect transistor has a channel length L and width W of about 50 μm and about 2000 μm, respectively.

TEM Image Measurement of Bulk Heterojunction Active Layer

Figure 9:
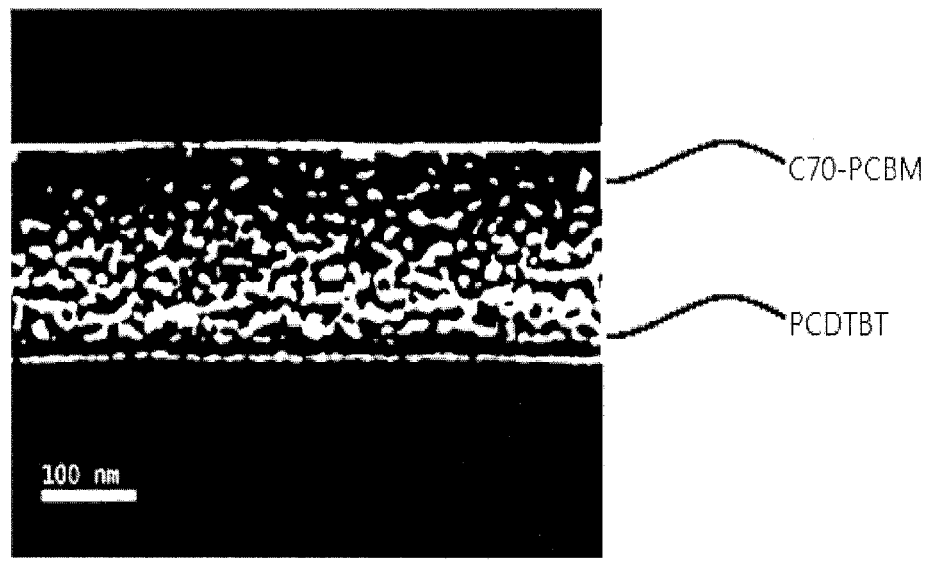
FIG. 9 is a transmission electron microscope (TEM) photograph of a bulk heterojunction active layer formed according to an experimental example.

The cross-section of the fabricated dual gate organic field effect transistor is measured by TEM and converted into a binary image, and the result is illustrated in FIG. 9. Referring to FIG. 9, the part indicated by the white color is a donor of p-type PCDTBT, and the part indicated by the black color is an acceptor of n-type C70-PCBM. The result of FIG. 9 shows that donors and acceptors are vertically phase separated, p-type carriers are mainly localized in the lower region, and n-type carriers are mainly localized in the upper region.

I-V Characteristic Measurement

Figure 10:
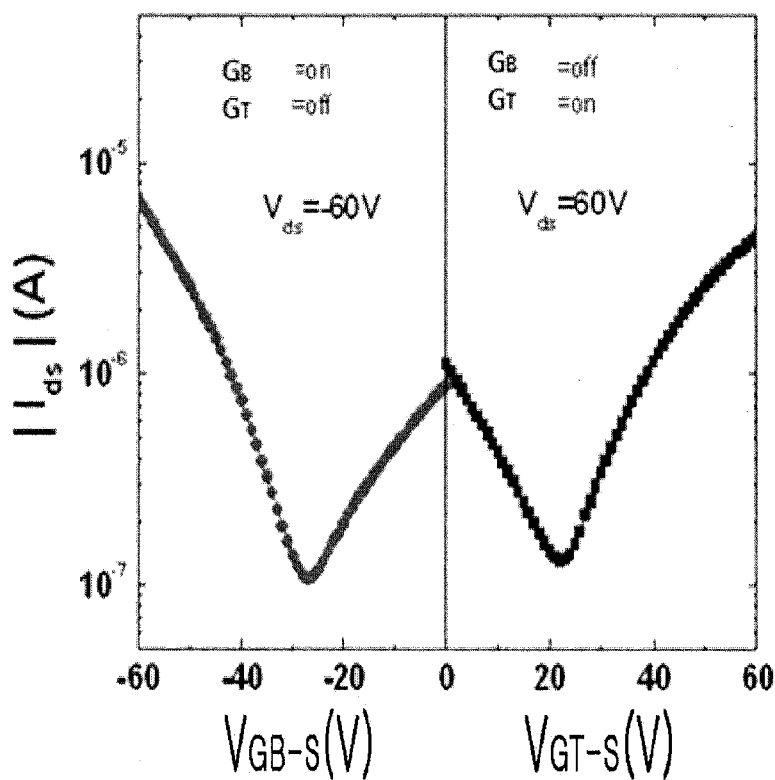
FIG. 10 is a graph showing an I-V characteristic of a dual gate organic field effect transistor formed according to an experimental example.

The measurement result of I-V characteristic of the fabricated dual gate organic field effect transistor is illustrated in FIG. 10. The result of FIG. 10 shows that if a positive voltage is applied to the upper gate electrode, the lower gate electrode is allowed to float and a positive voltage is applied to the drain, so the dual gate organic field effect transistor may be operated as an N-channel device. If a negative voltage is applied to the lower gate electrode, the upper gate electrode is allowed to float and a negative voltage is applied to the drain, so the dual gate organic field effect transistor may be operated as a P-channel device. Therefore, it can be seen that main distribution of the majority carriers in the bulk heterojunction active layer effectively occurs. It can also be seen that mobility of a saturated condition is about 0.02 cm/Vs for an n-type transistor and about 0.04 cm/Vs for a p-type transistor, in other words, the mobility is improved.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic electronic device comprising:
   an active region polarity definition layer; and
   a bulk heterojunction active layer formed on the active region polar definition layer, the bulk heterojunction active layer including an upper region and a lower region having respective majority carriers localized therein of different polarities.

2. The organic electronic device of claim 1, wherein in the upper region and the lower region of the bulk heterojunction active layer, a mobility of the majority carriers having the same polarity is different.

3. The organic electronic device of claim 1, wherein a surface of the active region polarity definition layer has a hydrophobic characteristic and the majority carriers in the lower region of the bulk heterojunction active layer are p-type carriers, or the surface of the active region polarity definition layer has a hydrophilic characteristic and the majority carriers in the lower region of the bulk heterojunction active layer are n-type carriers.

4. The organic electronic device of claim 3, wherein the active region polarity definition layer has a thickness of about 1 nm to about 30 nm.

5. The organic electronic device of claim 3, wherein the bulk heterojunction active layer consists of a mixture of a donor and an acceptor, the donor is selected from the group consisting of poly(3-hexylthiophene) (P3HT), poly[2-methoxy-5-(2'-ethyl-hexyloxy)-1,4-phenylene vinylene] (MEH-PPV), poly[2,1,3-benzothiadiazole-4,7-diyl[4,4-bis(2-ethylhexyl)-4H-cyclopenta[2,1-b:3,4-b']dithiophene-2,6-diyl] (PCPDTBT), and copper phthalocyanine (CuPc), and the acceptor is selected from the group consisting of [6,6]-Phenyl-C61-butyric acid methyl ester (C60-PCBM), [6,6]-Phenyl-C71-butyric acid methyl ester (C70-PCBM), perylene, and 3,4,9,10-perylenetetracarboxylic-bis-benzimidazole (PTCBI).

6. The organic electronic device of claim 3, wherein the bulk heterojunction active layer consists of a mixture of a donor and an acceptor, and the mixture is selected from the group consisting of a mixture of PCPDTBT and C70-PCBM, a mixture of P3HT and C60-PCBM, and a mixture of P3HT and C70-PCBM.

7. The organic electronic device of claim 1, wherein
the active region polarity definition layer includes at least two active regions, and a device isolation region is between the at least two active regions, and
a polarity slope of the bulk heterojunction active layer on the device isolation region is smaller than a polarity slope of the bulk heterojunction active layer on the at least two active regions.

8. The organic electronic device of claim 7, wherein the active region polarity definition layer includes first and second active region polarity definition layers corresponding with first and second active regions of the active region polarity definition layer, a device isolation region is between the first and second active regions, the first active region polarity definition layer and the second active region polarity definition layer have different surface characteristics, and the majority carriers in the lower region of the bulk heterojunction active layer on the first active region polarity definition layer and the majority carriers in the lower region of the bulk heterojunction active layer on the second active region polarity definition layer have different polarities.

9. The organic electronic device of claim 8, wherein the polarity slope of the bulk heterojunction active layer on the device isolation region is smaller than the polarity slope of the bulk heterojunction active layer on the first and second active region polarity definition layers.

10. The organic electronic device of claim 1, wherein the organic electronic device is a dual gate organic field effect transistor, further comprising:
a lower gate insulating layer configured to contact the lower region of the active region polarity definition layer;
a lower gate electrode configured to contact the lower gate insulating layer;
an upper gate insulating layer configured to contact the bulk heterojunction active layer;
an upper gate electrode configured to contact the upper gate insulating layer; and
a source/drain electrode configured to contact one of the lower gate insulating layer and the upper gate insulating layer.

11. The organic electronic device of claim 10, wherein the organic electronic device is an ambipolar dual gate organic field effect transistor, and the lower gate electrode and the upper gate electrode are electrically connected.

12. The organic electronic device of claim 1, wherein the organic electronic device is a vertically integrated complementary organic field effect transistor, further comprising:
a lower organic field effect transistor including a first polar channel consisting of the lower region of the bulk heterojunction active layer; and
an upper organic field effect transistor including a second polar channel consisting of the upper region of the bulk heterojunction active layer.

13. The organic electronic device of claim 1, wherein
the organic electronic device is a multijunction solar cell, and
the bulk heterojunction active layer is a plurality of bulk heterojunction active layers sequentially stacked.

14. An analog circuit comprising the organic electronic device according to claim 1.

15. A method for fabricating an organic electronic device comprising:
forming an active region polar definition layer; and
forming a bulk heterojunction active layer on the active region polar definition layer, the bulk heterojunction active layer including an upper region and a lower region having majority carriers of different respective polarities localized therein.

16. The method of claim 15, wherein in the upper region and the lower region of the bulk heterojunction active layer, a mobility of the majority carriers having the same polarity is different.

17. The method of claim 15, wherein a surface of the active region polarity definition layer has a hydrophobic characteristic and the majority carriers in the lower region of the bulk heterojunction active layer are p-type carriers, or the surface of the active region polarity definition layer has a hydrophilic characteristic and the majority carriers in the lower region of the bulk heterojunction active layer are n-type carriers.

18. The method of claim 17, wherein the active region polarity definition layer is formed such that the thickness is in the range of about 1 nm to about 30 nm.

19. The method of claim 17, wherein the forming the bulk heterojunction active layer comprises:
forming a film with a mixture of a donor and an acceptor by a solution process,
wherein the donor is selected from the group consisting of poly(3-hexylthiophene) (P3HT), poly[2-methoxy-5-(2'-ethyl-hexyloxy)-1,4-phenylene vinylene] (MEH-PPV), poly[2,1,3-benzothiadiazole-4,7-diyl [4,4-bis(2-ethylhexyl)-4H-cyclopenta[2,1-b: 3,4-b] dithiophene-2,6-diyl] (PCPDTBT), and copper phthalocyanine (CuPc), and the acceptor is selected from the group consisting of [6,6]-Phenyl-C61-butyric acid methyl ester (C60-PCBM), [6,6]-Phenyl-C71-butyric acid methyl ester (C70-PCBM), perylene, and 3,4,9,10-perylenetetracarboxylic-bis-benzimidazole (PTCBI).

20. The method of claim 17, wherein the forming the bulk heterojunction active layer comprises:
forming a film with a mixture of a donor and an acceptor by a solution process,
wherein the mixture is selected from the group consisting of a mixture of PCPDTBT and C70-PCBM, a mixture of P3HT and C60-PCBM, and a mixture of P3HT and C70-PCBM.

21. The method of claim 19, after the forming the film, further comprising:
performing a first annealing process at a lower temperature than a lower of glass transition temperatures of each of the donor and the acceptor.

22. The method of claim 21, after the performing the first annealing process, further comprising:
performing a second annealing process at a higher temperature than a lower of the glass transition temperatures of each of the donor and the acceptor, and at a lower temperature than a higher of the glass transition temperatures of each of the donor and the acceptor.

23. The method of claim 15, wherein
the forming the active region polarity definition layer includes,
forming at least two active regions in the active region polarity definition layer, and
separately patterning the active region polarity definition layer according to the at least two active regions so as to expose a device isolation region; and
the forming the bulk heterojunction active layer includes,
forming the bulk heterojunction active layer such that a polarity slope of the bulk heterojunction active layer on the device isolation region is smaller than a polarity slope of the bulk heterojunction active layer on the at least two active regions.

24. The method of claim 15, wherein
the forming the active region polarity definition layer includes,
forming first and second active regions in the active region polarity definition layer, and
separately patterning the active region polarity definition layer according to the first and second active regions so as to expose a device isolation region and form first and second active region polarity definition layers corresponding with the first and second active regions, the first and second active region polarity definition layers having different surface characteristics, and
the forming the bulk heterojunction active layer includes,
forming the bulk heterojunction active layer such that the majority carriers in the lower region of the bulk heterojunction active layer on the first active region polarity definition layer and the majority carriers in the lower region of the bulk heterojunction active layer on the second active region polarity definition layer have different polarities.

25. The method of claim 24, wherein the bulk heterojunction active layer is formed such that the polarity slope of the bulk heterojunction active layer on the device isolation region is smaller than the polarity slope of the bulk heterojunction active layer on the first and second active region polarity definition layers.

26. The method of claim 15, wherein the forming the bulk heterojunction active layer comprises:
sequentially stacking a first bulk heterojunction active layer and a second bulk heterojunction active layer on the active region polar definition layer.

* * * * *

UNITED STATES PATENT AND TRADEMARK OFFICE
CERTIFICATE OF CORRECTION

PATENT NO.          : 8,552,421 B2                      Page 1 of 1
APPLICATION NO.     : 13/413109
DATED               : October 8, 2013
INVENTOR(S)         : Sang Yoon Lee et al.

It is certified that error appears in the above-identified patent and that said Letters Patent is hereby corrected as shown below:

On the title page, item 73 should read:

Assignee: Samsung Electronics Co., Ltd., Gyeonggi-do (KR)
The Regents of the University of California, Oakland, CA (US)

Signed and Sealed this
First Day of April, 2014

Michelle K. Lee
*Deputy Director of the United States Patent and Trademark Office*